United States Patent
Feng et al.

(10) Patent No.: US 12,334,988 B2
(45) Date of Patent: Jun. 17, 2025

(54) REFLECTIVE AND INTERFERENCE CONTROLLED ABSORPTIVE CONTACTOR

(71) Applicant: XCERRA CORPORATION, Norwood, MA (US)

(72) Inventors: Yukang Feng, San Jose, CA (US); Jason Mroczkowski, Stillwater, MN (US); Nadia Steckler, Lino Lakes, MN (US); Aaren Lonks, Hadley, NY (US); Martin Cavegn, Lino Lakes, MN (US); James Hattis, Minnetonka, MN (US); Michael Hanks, Rosemount, MN (US)

(73) Assignee: Xcerra Corporation, Norwood, MA (US)

(*) Notice: Subject to any disclaimer, the term of this patent is extended or adjusted under 35 U.S.C. 154(b) by 672 days.

(21) Appl. No.: 17/384,133

(22) Filed: Jul. 23, 2021

(65) Prior Publication Data

US 2023/0024755 A1    Jan. 26, 2023

(51) Int. Cl.
*H04B 17/00* (2015.01)

(52) U.S. Cl.
CPC ................ *H04B 17/0085* (2013.01)

(58) Field of Classification Search
CPC ................ H04B 17/00; G01R 1/04
See application file for complete search history.

(56) References Cited

U.S. PATENT DOCUMENTS

| | | | | |
|---|---|---|---|---|
| 4,517,116 A | * | 5/1985 | Ivory | C08L 65/02 252/500 |
| 5,833,603 A | * | 11/1998 | Kovacs | G01J 3/02 600/109 |
| 6,981,889 B1 | | 1/2006 | Grothen et al. | |
| 10,425,169 B2 | * | 9/2019 | Partee | H04B 17/0085 |
| 11,212,910 B1 | * | 12/2021 | Lin | H05K 1/116 |
| 11,322,831 B1 | * | 5/2022 | Rmili | H01Q 1/32 |
| 2005/0001645 A1 | * | 1/2005 | Humphrey | B08B 1/10 324/758.01 |
| 2007/0008049 A1 | * | 1/2007 | Dyckman | G06F 30/367 333/33 |
| 2007/0230100 A1 | * | 10/2007 | Locker | H05K 3/284 361/679.01 |
| 2007/0257689 A1 | * | 11/2007 | Dalton | G01R 3/00 324/756.07 |
| 2012/0176906 A1 | * | 7/2012 | Hartenstein | H04L 43/50 370/241 |

(Continued)

FOREIGN PATENT DOCUMENTS

WO    2019168587 A1    9/2019

OTHER PUBLICATIONS

Patent Cooperation Treaty, International Search Report and Written Opinion for PCT/US2022/036905, 14 pages, dated Sep. 28, 2022.

*Primary Examiner* — Dominic E Rego

(74) *Attorney, Agent, or Firm* — Knobbe, Martens, Olson & Bear, LLP

(57) ABSTRACT

An apparatus including a contactor having a hole and including a radio frequency absorptive material and a probe inserted in the hole to couple a test signal to a device under test is disclosed. A test system for testing integrated circuits including a contactor including a radio frequency absorptive material is disclosed. A method for making the contactor is also disclosed.

20 Claims, 7 Drawing Sheets

(56) References Cited

U.S. PATENT DOCUMENTS

| | | | | |
|---|---|---|---|---|
| 2013/0077034 | A1* | 3/2013 | Jung | G02F 1/13458 |
| | | | | 349/122 |
| 2013/0204439 | A1* | 8/2013 | Scelzi | G05B 11/01 |
| | | | | 702/61 |
| 2014/0166390 | A1* | 6/2014 | Center | H04R 1/02 |
| | | | | 181/199 |
| 2014/0197860 | A1* | 7/2014 | Hsu | G01R 1/07357 |
| | | | | 324/756.07 |
| 2015/0083863 | A1* | 3/2015 | Karthauser | F03D 80/40 |
| | | | | 219/209 |
| 2015/0137848 | A1 | 5/2015 | Lewinnek et al. | |
| 2015/0168450 | A1* | 6/2015 | Wooden | G01R 1/0466 |
| | | | | 324/756.02 |
| 2016/0178663 | A1* | 6/2016 | Prabhugoud | G01R 1/0466 |
| | | | | 324/750.24 |
| 2016/0263823 | A1* | 9/2016 | Espiau | B29C 64/118 |
| 2020/0083582 | A1 | 3/2020 | Mroczkowski et al. | |
| 2020/0150148 | A1* | 5/2020 | Chung | H01R 33/76 |
| 2020/0191651 | A1* | 6/2020 | Poteet | G01N 21/35 |
| 2021/0048452 | A1* | 2/2021 | Yang | G01R 1/06722 |
| 2021/0085973 | A1* | 3/2021 | Ghezzi | A61N 1/36046 |
| 2021/0148836 | A1* | 5/2021 | Hameed | G01N 22/04 |
| 2021/0223285 | A1 | 7/2021 | Feng et al. | |
| 2021/0288031 | A1* | 9/2021 | Chen | H01L 33/0095 |
| 2021/0349128 | A1* | 11/2021 | Chen | G01R 31/00 |
| 2021/0372881 | A1* | 12/2021 | Walters | G01M 11/37 |
| 2022/0214380 | A1* | 7/2022 | Lin | G01R 1/07357 |
| 2022/0364683 | A1* | 11/2022 | McCormick | F17C 13/06 |

* cited by examiner

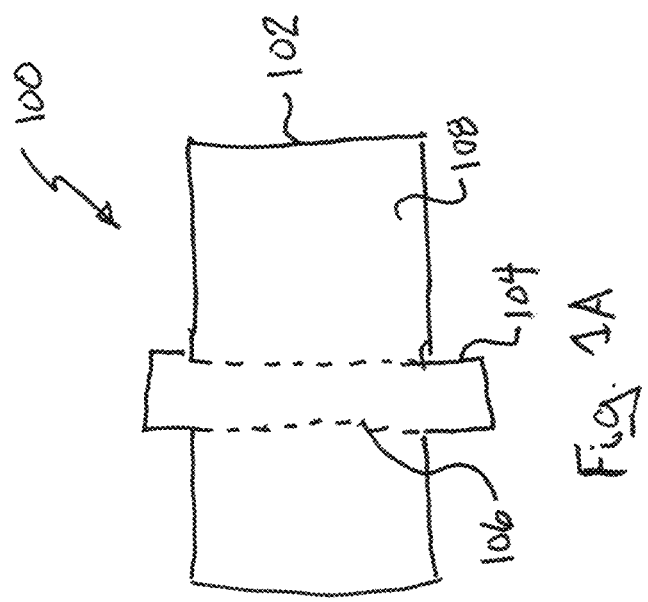

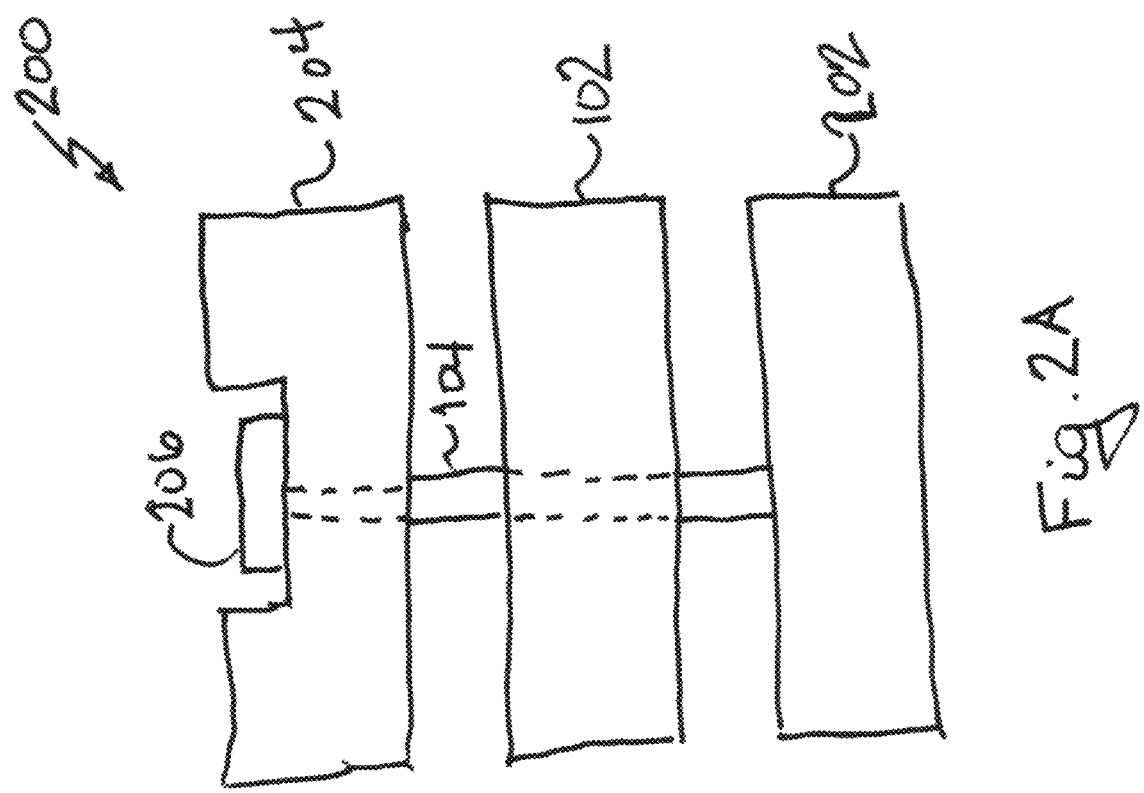

300

FORM A CONTADCTOR INCLUDING FORMING A RADIO FREQEUNCY ABSORPTIVE MATER AS A COMPOENT OF THE CONTACTOR

302

FORM A HOLE IN THE CONTACTOR

304

INSERT A PROBE INTO THE HOLE

REFLECTIVE AND INTERFERENCE CONTROLLED ABSORPTIVE CONTACTOR

FIELD

The present disclosure relates to integrated circuit test systems. In particular, the disclosure relates to a test system contactor that couples a test signal to a device under test.

BACKGROUND

As the frequencies required to test integrated circuits increase, the present contactor designs that couple a test signal to a device under test are unable to maintain signal integrity of the test signals transmitted to the device under test. For example, the amount of RF reflection in the body of the contactor can negatively impact the test. For these and other reasons there is a need for the subject matter of the present disclosure.

SUMMARY

Consistent with the disclosed embodiments, an apparatus for use in coupling a test signal to a device under test in an integrated circuit test system is disclosed. The apparatus comprises a contactor having a hole. The contactor includes a radio frequency absorptive material. A probe is inserted in the hole. The probe to couple a test signal to a device under test. In some embodiments, the radio frequency absorptive material comprises an elastomer. In some embodiments, the radio frequency absorptive material comprises a polymer. In some embodiments, the radio frequency absorptive material comprises a foam rubber. In some embodiments, the test signal has a test signal energy and the radio frequency absorptive material absorbs a significant portion of the test signal energy in a frequency band of between about DC and about 110 GHz. In some embodiments, the contactor includes a plurality of layers. At least one of the plurality of layers includes the radio frequency absorptive material.

Consistent with the disclosed embodiments, an apparatus for use in coupling a test signal to a device under test in an integrated circuit test system is disclosed. The apparatus comprises a radio frequency test signal source, a mounting fixture for mounting a device under test, and a contactor including a radio frequency absorptive material and a probe, the contactor to couple the radio frequency test signal source to the device under test. In some embodiments, the radio frequency absorptive material comprises an elastomer. In some embodiments, the radio frequency absorptive material comprises a polymer. In some embodiments, the radio frequency absorptive material comprises a foam rubber. In some embodiments, the signal has a test signal energy and the radio frequency absorptive material absorbs a significant portion of the test signal energy in a frequency band of between about DC and about 110 GHz. In some embodiments, the contactor includes a plurality of layers and at least one of the plurality of layers includes the radio frequency absorptive material. In some embodiments, the plurality of layers includes a hole passing through each of the plurality of layers, the hole having a size in each of the plurality of layers and the size varying in each of the plurality of layers. In some embodiments, a probe inserted in the hole has an impedance and the size of the hole in each of the plurality of layers is selected to control the impedance. In some embodiments, the size of the hole is a diameter of a circle substantially defining the hole.

Consistent with the disclosed embodiments, a method for forming an apparatus for use in coupling a test signal to a device under test in an integrated circuit test system is disclosed. The method comprises forming a contactor including forming a radio frequency absorptive material as a component of the contactor, forming a hole in the contactor, and inserting a probe into the hole. In some embodiments, forming the radio frequency absorptive material as a component of the contactor comprises 3-D printing the radio frequency absorptive material. In some embodiments, forming the radio frequency absorptive material as a component of the contactor comprises molding the radio frequency absorptive material. In some embodiments, forming the radio frequency absorptive material as a component of the contactor comprises coating a dielectric material included in the contactor with the radio frequency absorptive material. In some embodiments, forming the radio frequency absorptive material comprises micro-machining the radio frequency absorptive material.

It is to be understood that both the foregoing general description and the following detailed description are exemplary and explanatory only and are not restrictive of the invention, as claimed.

The accompanying drawings, which are incorporated in and constitute a part of this specification, illustrate embodiments of the invention and together with the description, serve to explain the principles of the invention.

BRIEF DESCRIPTION OF THE DRAWINGS

FIG. 1A shows an illustration of an apparatus including a contactor and a probe in accordance with some embodiments of the present disclosure;

FIG. 2A shows an apparatus including a radio frequency test signal source, a mounting fixture, a probe, and a contactor in accordance with some embodiments of the present disclosure;

FIG. 3 shows a flow diagram of a method for forming the apparatus shown in FIG. 1A in accordance with some embodiments of the present disclosure.

DESCRIPTION

Figure 1B:
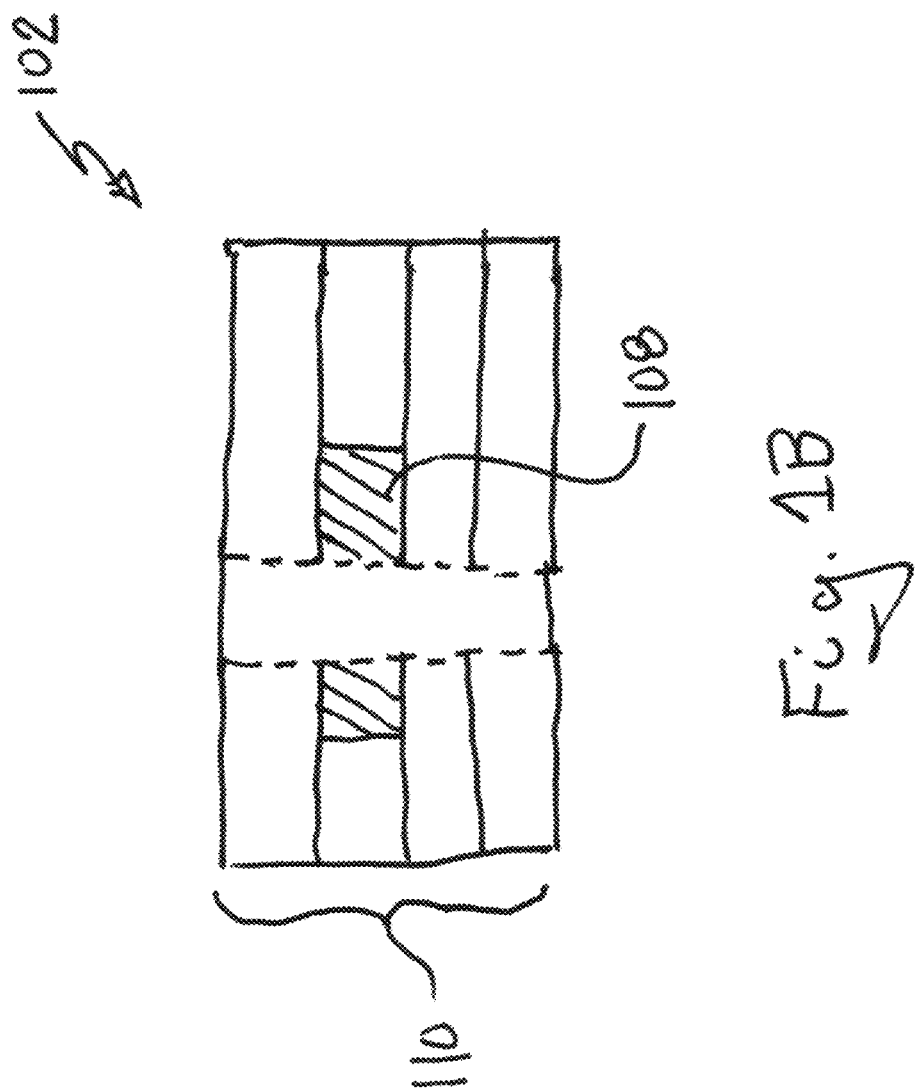
FIG. 1B shows a contactor including a plurality of layers in accordance with some embodiments of the present disclosure.

Reference will now be made in detail to the exemplary embodiments of the present disclosure described below and illustrated in the accompanying drawings. Wherever possible, the same reference numbers will be used throughout to refer to same or like parts.

While the present invention is described herein with reference to illustrative embodiments for particular applications, it should be understood that the invention is not limited thereto. Those having ordinary skill in the art and access to the teachings provided herein will recognize additional modifications, applications, embodiments, and substitution of equivalents, that all fall within the scope of the disclosure. Accordingly, the disclosure is not to be considered as limited by the foregoing or following descriptions.

FIG. 1A shows an illustration of an apparatus 100 including a contactor 102 and a probe 104 in accordance with some embodiments of the present disclosure. The contactor 102 has a hole 106 and includes a radio frequency absorptive material 108. As shown, the probe 104 is inserted in the hole 106. In operation, the probe 104 couples a test signal to a device under test.

The radio frequency absorptive material 108 is not limited to a particular material. In some embodiments, the absorptive material 108 includes a low-loss dielectric material. A low-loss dielectric material has a loss tangent of less than about 0.5%. In some embodiments, the radio frequency absorptive material 108 has an attenuation on the order of tens of dB per centimeter along a radio frequency signal propagation path.

In some embodiments, the radio frequency absorptive material 108 is an elastomer. Weak intermolecular forces provide binding in elastomers. Examples of elastomers suitable for use in embodiments of the present disclosure include natural rubber, polyurethane, polybutadiene, silicone, and neoprene.

In some embodiments, the absorptive material 108 is a polymer. A polymer is a macromolecule including repetition of molecules of low relative molecular mass. Polymers have molecular weights of between about a few thousand and millions of grams/mole.

In some embodiments, the radio frequency absorptive material 108 is a foam rubber. A foam rubber is a rubber formed using a foaming agent to create an gas-filled matrix structure. Example foam rubbers suitable for use in embodiments of the present disclosure include synthetic rubber, natural latex, and polyurethane. Polyurethane is a thermosetting polymer that includes methyl di-isocyanate and polyethylene.

The hole 106 has a cross-sectional shape. The cross-sectional shape in this disclosure is not limited to a particular cross-sectional shape. In some embodiments, the cross-sectional shape is a circle. For embodiments having a circular cross-sectional shape, the circular cross-sectional shape has a diameter.

In operation, the probe 104 transmits a test signal to a device under test. The test signal has a test signal energy and the radio frequency absorptive material absorbs a significant portion of the test signal energy at a frequency band between about DC and about 110 GHz The absorptive material 108 is selected to have a loss tangent and dimensions that provide radio frequency energy reflection of less than about 10%.

FIG. 1B shows a contactor 102 including a plurality of layers 110 in accordance with some embodiments of the present disclosure. At least one of the plurality of layers 110 includes the radio frequency absorptive material 108. The radio frequency absorptive material 108 is not limited to forming a complete layer of one of the plurality of layers 110. The radio frequency absorptive material 108, in some embodiments, may form only a portion of one of the plurality of layers 110.

Figure 2B:
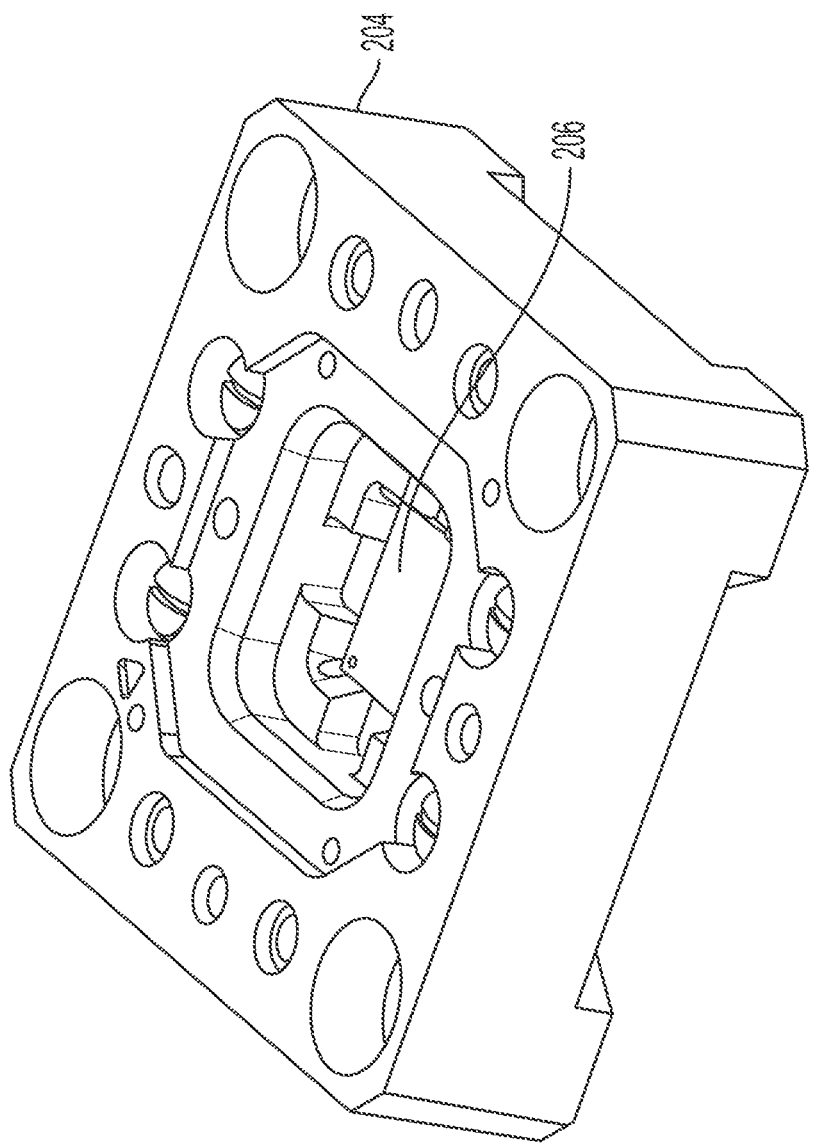
FIG. 2B shows a perspective illustration of the mounting fixture including a device under test in accordance with some embodiments of the present disclosure.

FIG. 2A shows an apparatus 200 including a radio frequency test signal source 202, a mounting fixture 204, probe 104, and the contactor 102 in accordance with some embodiments of the present disclosure. In some embodiments, the radio frequency test signal source 202 includes a printed circuit board having traces to couple a test signal to the probe 104. The mounting fixture 204 provides a structure to hold a device under test 206, such as in integrated circuit. FIG. 2B shows a perspective illustration of the mounting fixture 204 including the device under test 206 in accordance with some embodiments of the present disclosure. Referring again to FIG. 2A, the contactor 102 includes the radio frequency absorptive material 108 and the probe 104. The contactor 102 couples the radio frequency test signal source 202 to the device under test 206. In operation, the radio frequency test signal source 202 provides a test signal to the device under test 206. The test signal has a test signal energy and the radio frequency absorptive material 108 absorbs a significant portion of the test signal energy in a frequency band between about DC and about 110 GHz. As noted above the radio frequency absorptive material 108 is not limited to being formed from a particular material. Example materials suitable for use in connection with the fabrication of the contactor 102 include elastomers, polymers, and foam rubber. Materials not suitable for use in the fabrication of the radio frequency absorptive material 108 includes alumina materials (aluminium oxide purity higher than 95%). In some embodiments, the contactor 102 includes a plurality of layers 110 (shown in FIG. 1B), and at least one of the plurality of layers 110 includes the radio frequency absorptive material 108 (shown in FIG. 1B). Those skilled in the art will appreciate that FIG. 2A is only one embodiment of the present disclosure and that other embodiments in which each of the plurality of layers 110 includes one types of absorptive materials 108 is not precluded by the embodiment disclosed in FIG. 2A. In addition, in the embodiment shown in FIG. 2A, the plurality of layers 110 may or may not included a layer including air.

Figure 2C:
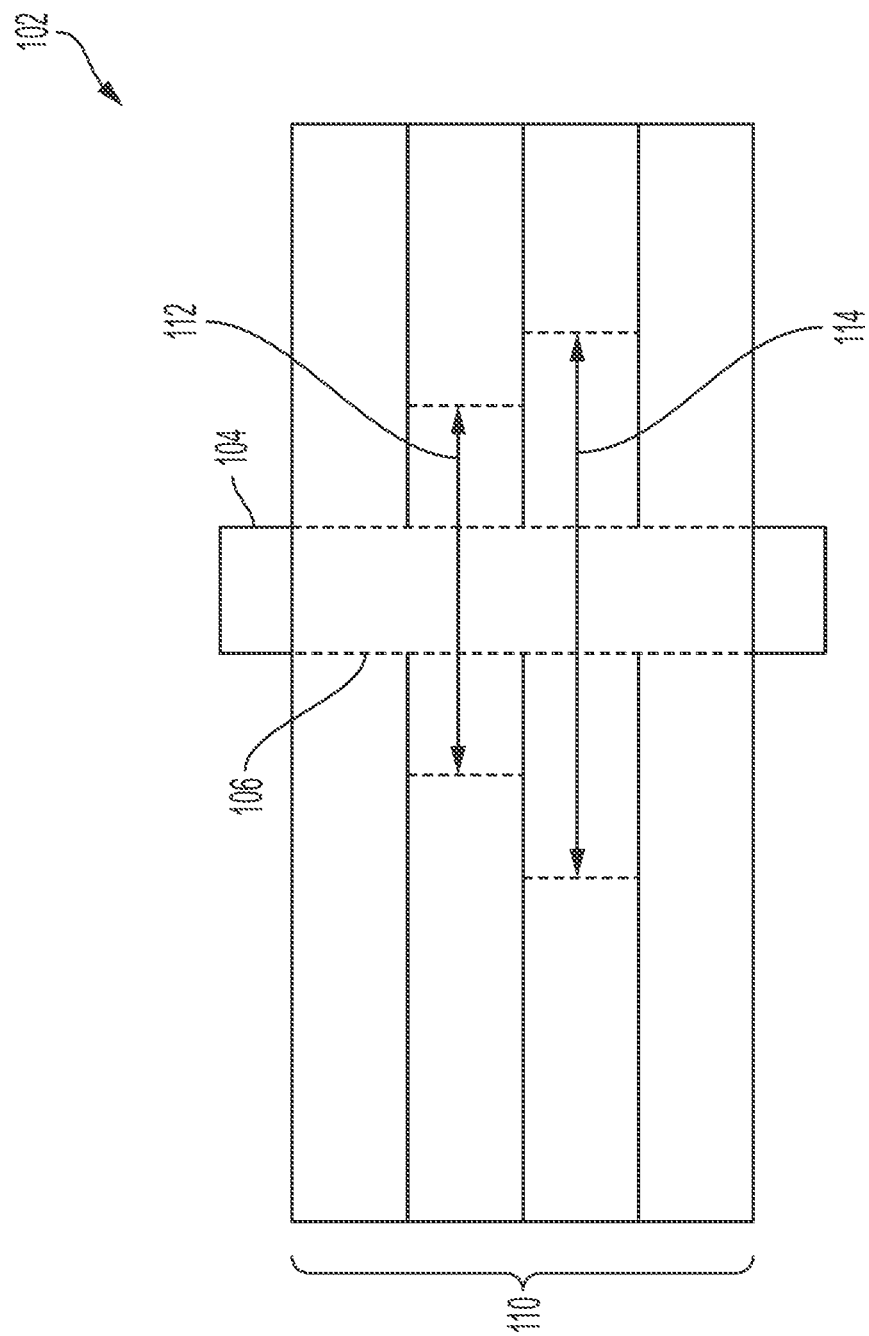
FIG. 2C shows a contactor including the plurality of layers and a hole passing through each of the plurality of layers in accordance with some embodiments of the present disclosure.

FIG. 2C shows a contactor 102 including the plurality of layers 110 and a hole 106 passing through each of the plurality of layers 110 in accordance with some embodiments of the present disclosure. The hole 106 has a size and, in some embodiments, the size varies in at least two of the plurality of layers 110. For example, as shown in FIG. 2B, the size of the hole 112 is smaller than the size of the hole 114. Referring again to FIG. 2C, the size is defined by the dimensions of the cross-sectional shape of the hole 106. In operation, the probe 104 is inserted in the hole 106. The probe 104 inserted in the hole 106 has an impedance and the size of the hole in each of the plurality of layers is selected to control the impedance.

Figure 2D:
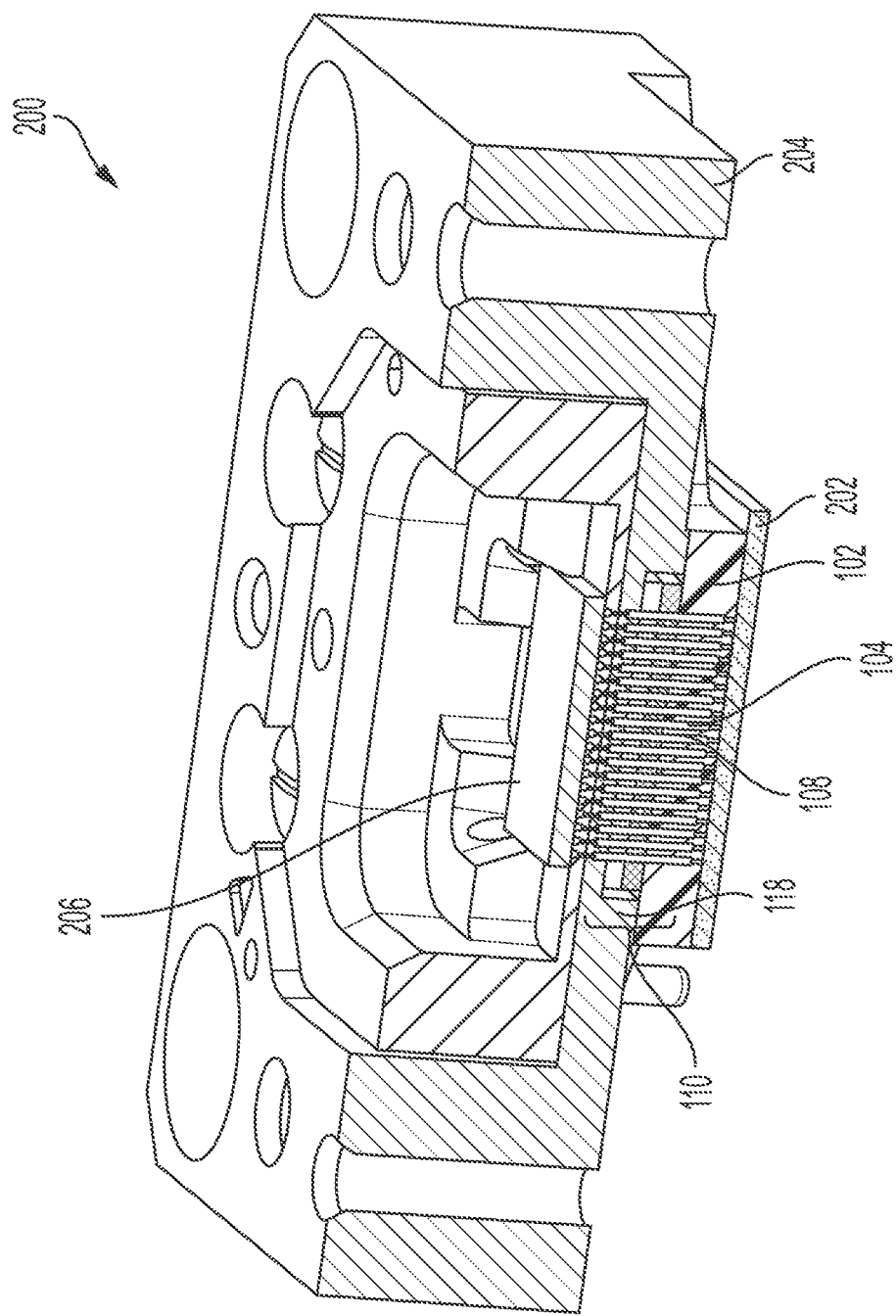
FIG. 2D shows a cut-away perspective illustration of an apparatus including a radio frequency test signal source, a mounting fixture, a device undertest, a contactor including a plurality of layers, a probe and a radio frequency absorptive material in accordance with some embodiments of the present disclosure.

FIG. 2D shows a cut-away perspective illustration of the apparatus 200 including the radio frequency test signal source 202, the mounting fixture 204, the device undertest 206, the contactor 102 including the plurality of layers 110, the probe 104 and the radio frequency absorptive material 108 in accordance with some embodiments of the present disclosure. As shown, the radio frequency absorptive material 108 forms less than 100% of a layer 118. However, in some embodiments, the radio frequency absorptive material 108 forms substantially 100% of the layer 118.

FIG. 3 shows a flow diagram of a method for forming the apparatus shown in FIG. 1A in accordance with some embodiments of the present disclosure. The method includes forming a contactor including forming a radio frequency absorptive material as a component of the contactor (block 302), forming a hole in the contactor (block 304), and inserting a probe into the hole (block 306). In some embodiments, forming the radio frequency absorptive material as a component of the contactor includes 3-D printing the radio frequency absorptive material. In some embodiments, forming the radio frequency absorptive material as a component of the contactor includes molding the radio frequency absorptive material. In some embodiments, forming the radio frequency absorptive material as a component of the contactor includes coating a dielectric material included in the contactor with the radio frequency absorptive material. In some embodiments, forming the radio frequency absorptive material as a component of the contactor includes micro-machining the radio frequency absorptive material.

Reference throughout this specification to "an embodiment," "some embodiments," or "one embodiment." means that a particular feature, structure, material, or characteristic described in connection with the embodiment is included in at least one embodiment of the present disclosure. Thus, the appearances of the phrases such as "in some embodiments," "in one embodiment," or "in an embodiment," in various places throughout this specification are not necessarily referring to the same embodiment of the present disclosure. Furthermore, the particular features, structures, materials, or characteristics may be combined in any suitable manner in one or more embodiments.

Although explanatory embodiments have been shown and described, it would be appreciated by those skilled in the art that the above embodiments cannot be construed to limit the present disclosure, and changes, alternatives, and modifications can be made in the embodiments without departing from spirit, principles and scope of the disclosure.

What is claimed is:

1. An apparatus comprising:
    a contactor comprising a stack of three or more planar layers including outer layers interposed by a middle layer, each of the layers having a hole formed therethrough, wherein at least the middle layer includes a radio frequency absorptive material and a hole having a larger lateral size relative to lateral sizes of the holes of the outer layers; and
    a probe inserted to pass through the hole of each of the layers, the probe configured to couple a test signal to a device under test.

2. The apparatus of claim 1, wherein the radio frequency absorptive material comprises an elastomer.

3. The apparatus of claim 1, wherein the radio frequency absorptive material comprises a polymer.

4. The apparatus of claim 1, wherein the radio frequency absorptive material comprises a foam rubber.

5. The apparatus of claim 1, wherein the test signal has a test signal energy and the radio frequency absorptive material absorbs a significant portion of the test signal energy in a frequency band between about DC and about 110 GHz.

6. The apparatus of claim 1, wherein each of the layers includes the radio frequency absorptive material.

7. An apparatus comprising:
    a radio frequency test signal source;
    a mounting fixture for mounting a device under test;
    a contactor including a stack of three or more planar layers including outer layers interposed by a middle layer, each of the layers having a hole formed therethrough, wherein at least the middle layer includes a radio frequency absorptive material; and
    a probe inserted to pass through the hole of each of the layers, wherein the hole of the middle layer has a larger lateral size relative to lateral sizes of the holes of the outer layers,
    wherein the contactor is configured to couple the radio frequency test signal source to the device under test.

8. The apparatus of claim 7, wherein the radio frequency absorptive material comprises an elastomer.

9. The apparatus of claim 7, wherein the radio frequency absorptive material comprises a polymer.

10. The apparatus of claim 7, wherein the radio frequency absorptive material comprises a foam rubber.

11. The apparatus of claim 7, wherein the test signal has a test signal energy and the radio frequency absorptive material absorbs a significant portion of the test signal energy in a frequency band between about DC and about 110 GHz.

12. The apparatus of claim 7, wherein each of the layers includes the radio frequency absorptive material.

13. The apparatus of claim 12, wherein the hole of each of the layers has a lateral size that is different from lateral sizes of the holes of the others of the layers.

14. The apparatus of claim 13, wherein the probe inserted in the hole has an impedance and the lateral size of the hole of each of the layers is selected to control the impedance.

15. A method comprising:
    forming a contactor including forming a stack of three or more planar layers including outer layers interposed by a middle layer, wherein at least the middle layer includes a radio frequency absorptive material as a component of the contactor;
    forming a hole through each of the layers, wherein the hole of the middle layer has a larger lateral size relative to lateral sizes of the holes of the outer layers; and
    inserting a probe to pass through the hole of each of the layers.

16. The method of claim 15, wherein forming the contactor comprises three-dimensionally printing the radio frequency absorptive material.

17. The method of claim 15, wherein forming the contactor comprises molding the radio frequency absorptive material.

18. The method of claim 15, wherein forming the contactor comprises coating a dielectric material included in the contactor with the radio frequency absorptive material.

19. The method of claim 15, wherein forming the contactor comprises micro-machining the radio frequency absorptive material.

20. The method of claim 15, wherein forming the hole through each of the layers comprises forming the holes having different sizes through different ones of the layers.

* * * * *